(12) United States Patent
Phan et al.

(10) Patent No.: US 6,171,737 B1
(45) Date of Patent: *Jan. 9, 2001

(54) LOW COST APPLICATION OF OXIDE TEST WAFER FOR DEFECT MONITOR IN PHOTOLITHOGRAPHY PROCESS

(75) Inventors: Khoi A. Phan; Shobhana R. Punjabi, both of San Jose; Robert J. Chiu, Mt. View; Bhanwar Singh, Morgan Hill, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/017,695

(22) Filed: Feb. 3, 1998

(51) Int. Cl.$^7$ ....................................................... G03F 9/00
(52) U.S. Cl. ........................... 430/30; 382/145; 382/149; 382/151
(58) Field of Search ........................ 430/30, 311; 257/48; 438/18; 702/117, 118, 121; 356/302, 305, 389, 390, 394; 382/145, 149, 151

(56) References Cited

U.S. PATENT DOCUMENTS

| | | | |
|---|---|---|---|
| 4,514,436 | * | 4/1985 | Moerschel ............................. 427/10 |
| 5,578,821 | * | 11/1996 | Meisberger et al. ................. 250/310 |
| 5,781,657 | * | 7/1998 | Masuda ................................. 382/147 |
| 5,808,735 | * | 9/1998 | Lee et al. ............................. 356/237 |
| 5,811,358 | * | 9/1998 | Tseng et al. .......................... 438/725 |
| 5,913,105 | * | 6/1999 | McIntyre et al. ..................... 438/16 |
| 5,943,437 | * | 8/1999 | Sumie et al. ......................... 382/149 |

OTHER PUBLICATIONS

Product Sheet, KLA Yield Management System, Sep. 29, 1994 (Series 2100).
Advertisement JEOL JWS–7500 Wafer Inspection System (date unknown).
Brochure, LEITZ MIS 200 Inspection and Review System (date unknown).

* cited by examiner

*Primary Examiner*—Christopher G. Young

(57) ABSTRACT

A low cost technique for detecting defects in photolithography processes in a submicron integrated circuit manufacturing environment combines use of a reusable test wafer with in-line processing to monitor defects using a pattern comparator system. A reusable test wafer having an oxide layer overlying a silicon substrate and having a thickness corresponding to a minimum reflectance for an exposure wavelength used for photolithography is patterned using a prescribed photolithographic fabrication process to form a repetitive pattern according to a prescribed design product rule. The pattern is formed using a reticle having a repetitive pattern array with a similar design rule as the product to be developed by the lithography processes. The patterned test wafer is then inspected using image-based inspection techniques, where the image has high resolution pixels of preferably 0.25 microns per pixel. An optical review station and scanning electron microscope system are used to review defect and classify defect types. The test wafer can then be reused by cleaning the photolithographic pattern by removing the photoresist, and then removing polymer particles adhering to the oxide layer following removal of the photoresist.

12 Claims, 9 Drawing Sheets

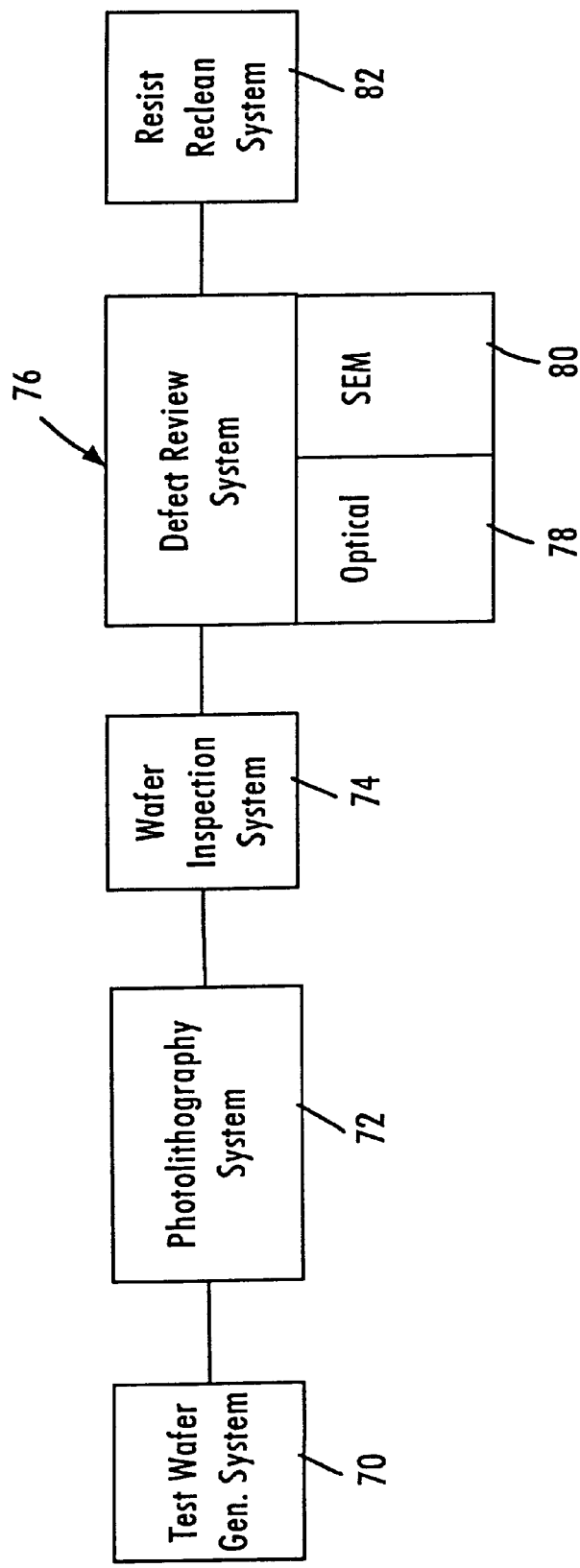

LOW COST APPLICATION OF OXIDE TEST WAFER FOR DEFECT MONITOR IN PHOTOLITHOGRAPHY PROCESS

BACKGROUND OF THE INVENTION

1. Technical Field

The present invention relates to techniques for detecting and reducing defects formed on a wafer during submicron lithography.

2. Description of Related Art

Manufacturing processes for submicron integrated circuits require strict process control for minimizing defects on integrated circuits. Defects are the primary "killers" of devices formed during manufacturing, resulting in yield loss. Hence, defect densities are monitored on a wafer to determine whether a production yield is maintained at an acceptable level, or whether an increase in the defect density creates an unacceptable yield performance. Hence, the detection and monitoring of defects is critical to maintaining an acceptable yield.

Conventional approaches monitor defects by performing an electrical testing of completed products following the fabrication steps (i.e., semiconductor devices), and by monitoring for defects on product wafers using defect inspection tools at various steps of the testing process. However, defect detection is difficult for multilayer devices, since defects may be present within any one of at least five or six layers for the most simple integrated circuit. If a defect passes through more than one layer, a defect inspection tool may erroneously detect a defect on a given layer that was already present from a previous layer. As such, it may be difficult to identify which layer has a certain problem generating the defect. Hence, the monitoring of defects on a product wafer may overwhelm the ability to distinguish whether a defect on a certain layer is caused during the fabrication of a corresponding layer, or caused by an embedded defect formed from a previous layer.

Although certain yield management systems permit in-line monitoring to monitor process defects at certain processing stages, such in-line monitoring systems may still erroneously detect a defect on a given layer that was already present from a previous layer. Moreover, additional testing cannot be performed to identify and classify defects without removing the wafer from production, increasing the production delay and cost.

The testing costs may be even higher since the in-line monitoring techniques require the silicon wafer to be scrapped after analysis. Specifically, in-line defect analysis requires a clean wafer having a substantially low defect density of approximately 0–5 particles (0.2 microns or larger) per wafer. Hence, a silicon wafer used for in-line defect monitoring cannot be reused because the defect density of the used silicon wafer after any attempted cleaning is unacceptably high.

In addition, cleaning a monitored wafer for attempted reuse must not change its optical properties such as reflectivity, otherwise the testing machine may obtain a substantially different image of the wafer, resulting in a failure. Hence, the changes in the optical properties of the cleaned monitor wafer would cause additional delays due to recalibration of the in-line testing equipment to accommodate the changes in reflectivity.

DISCLOSURE OF THE INVENTION

There is a need for a low cost arrangement for monitoring defects generated from a photolithography process in the fabrication of integrated circuits.

There is also a need for improving product sort yield and lowering manufacturing costs without unnecessarily scrapping silicon wafers used for the production of integrated circuits.

There is also a need for an arrangement for identifying defects and their associated causes in a low cost arrangement that accurately models fabrication processes.

There is also a need for a low cost arrangement for monitoring defects using reusable test wafers, where the test wafers have a low defect density following cleaning that enables reuse of the test wafers without recalibration of the testing equipment.

There is also a need for an alternative substrate for defect monitoring that can provide a low defect density following cleaning and that can be reusable a multiple number of times for defect monitoring.

There is also a need for an arrangement for cleaning a test wafer for reuse in detecting defects encountered during photolithography, where the cleaned test wafer has a sufficiently low particle count and stable optical characteristics acceptable for in-line testing without recalibration of test equipment such as inspection metrology tools.

These and other needs are attained by the present invention, where defects are monitored using a reusable test wafer, where formation of a pattern on the reusable test wafer enables image-based defect analysis to be performed for pattern-forming processes, such as photolithography. The test wafer is then cleaned using a process that provides a cleaned test wafer having a sufficiently low particle count for reuse for subsequent pattern-forming processes and image-based defect analysis. The cleaned test wafer also can retain its optical characteristics to enable reuse on inspection metrology tools without recalibration. As such, the process for cleaning a test wafer enables reuse of the test wafer for several cycles.

According to one aspect of the invention, a method of monitoring defects generated during formation of a pattern on a wafer comprises forming a test wafer having an oxide layer overlying on a silicon substrate of the wafer, forming a pattern on the oxide layer according to a prescribed fabrication process, the pattern related to a prescribed design product rule, inspecting the pattern to detect a defect, classifying the defect to a defect type and defect cause, and determining whether the pattern has a defect density below a prescribed threshold acceptable for wafer fabrication. Formation of the test wafer having an oxide layer overlying on the silicon substrate provides a low-cost technique in monitoring defects, since the test wafer can be reused by removing the pattern from the oxide layer following defect analysis for the pattern formed on the test wafer. In addition, the test wafer having the oxide layer has the advantages over other film substrates of providing a very low particle count after cleaning, and providing a low oxide loss that causes no impact on defect metrology tools, such as the pattern comparator.

In addition, forming the pattern on the oxide layer according to prescribed fabrication process enables detection and analysis of defects specific to the formation of the pattern according to the prescribed fabrication process. Hence, detected defects can be isolated and identified as having been caused by the corresponding fabrication process forming the pattern. Hence, the inspection and classification of defects associated with formation of the repetitive pattern enables specific defect types and causes to be classified, enabling corrective action to be implemented in the fabrication processes. If desired, a repetitive pattern may be used that maximizes the sensitivity of the defect metrology tools (e.g., the pattern comparator).

Another aspect of the present invention provides a system for monitoring defects on a wafer during photolithography processing, comprising a test wafer generation system for generating a test wafer having an oxide layer formed on a silicon substrate, the test wafer having a prescribed thickness that minimizes reflectance during the photolithography processing, a photolithography system forming a pattern on the test wafer using the photolithography processing, the pattern related to a prescribed design product rule, a wafer inspection system for detecting defects on the patterns based on pixel-based comparisons between adjacent patterns on the test wafer, and a defect review system for classifying the detected defects by respective types and causes, the defect review system generating a prioritized list of the defect causes. Generation of a test wafer by the test wafer generation system enables low-cost defect monitoring to be performed for the photolithography processing, since the pattern on the test wafer can be removed from the test wafer following testing in a manner that results in a sufficiently low particle count and low oxide loss that has no impact on a defect metrology tool and that enables reuse of the test wafer. In addition, formation of a repetitive pattern on the test wafer according to prescribed design product rules maximizes the sensitivity of the wafer inspection system and defect review system to efficiently detect and classify detected defects specific to the photolithography processing techniques forming the repetitive pattern on a test wafer. Hence, the generated prioritized list of the defect causes can be used by process engineers to improve the wafer fabrication process in an efficient manner.

Still another aspect of the present invention provides a method of cleaning a photolithographic pattern from a test wafer, where the test wafer has an oxide layer formed on a silicon substrate. The method includes removing photoresist forming the photolithographic pattern from the oxide layer, and removing polymer particles loosely adhering to the oxide layer following the photoresist removing step to enable reuse of the test wafer in a defect detection system. The method results in a cleaned test wafer having a sufficiently low particle count comparable in quality to a new test wafer to enable reuse in a defect detection system. In addition, the method causes minimal loss of the oxide layer, preserving the optical characteristics of the test wafer. Hence, defect detection and reduction techniques for submicron lithography can be implemented in a low cost manner by cleaning the test photolithographic pattern from the test wafer, since each cleaning operation results in a minimal loss of oxide thickness, eliminating the necessity of recalibrating a defect metrology tool such as a pattern comparator.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein:

FIG. 2 is a block diagram illustrating a defect monitoring system according to an embodiment of the present invention.

BEST MODE FOR CARRYING OUT THE INVENTION

Figure 1E:
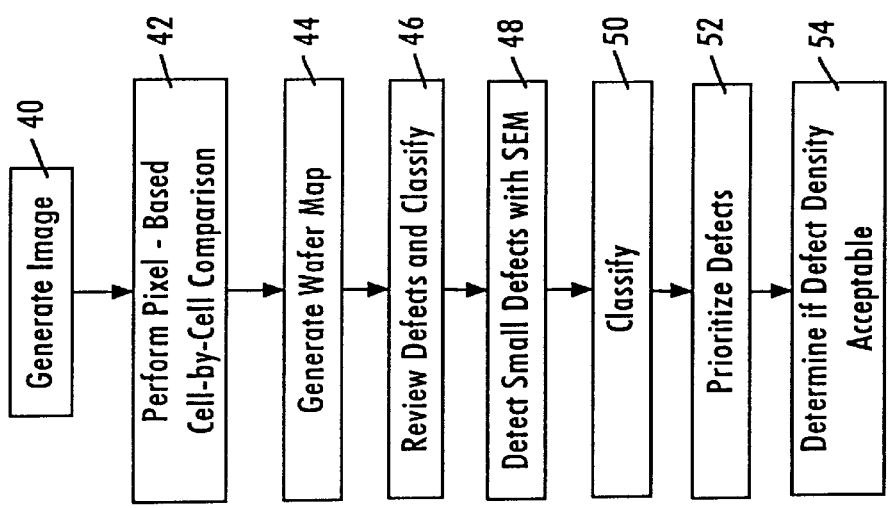
FIGS. 1A to 1E are diagrams illustrating the method for monitoring defects generated during formation of a pattern on a wafer according to an embodiment of the present invention.

The disclosed embodiment is directed to an arrangement for defect detection and reduction techniques for submicron lithography, where a reusable test wafer is used to form a repetitive pattern according to a prescribed fabrication process, followed by inspection and classification of the repetitive pattern for detected defects and defect types and causes. The test wafer can then be cleaned using a process that removes substantially all particles, resulting in a cleaned test wafer having a sufficiently low particle count comparable in quality to a new test wafer (0–5 particles, of minimum size 0.2 micron, per wafer) to enable reuse in a defect detection system. In addition, the cleaning process causes minimal loss of the oxide layer (approximately 1–2 Å), preserving the optical characteristics of the test wafer.

As described below, the disclosed embodiment uses a short-loop lithography process, followed by line monitor defect inspection (also referred to as in-line inspection), to identify defects associated with the fabrication process. A description will first be given of the general defect detection and reduction techniques used to inspect and classify defects, as well as to determine whether the repetitive pattern has a defect density below prescribed thresholds acceptable for wafer fabrication. A description will then be given of the use of these defect detection and reduction techniques for monitoring defects using a reusable test wafer according to an embodiment of the present invention. A description will then be given of the method for cleaning the test wafer according to an embodiment of the present invention.

DEFECT DETECTION AND REDUCTION TECHNIQUES

Accurate and reproducible microlithography processing is critical for developing smaller and more dimensionally accurate semiconductor structures. As modern microprocessors and memory devices scale down to deep submicron dimensions, defects originating in the microlithography processes become increasingly effective in reducing yield. Careful and efficient methods of measuring the variability of these defect levels by utilizing a short-loop monitoring process is essential in controlling the quality of lithography process for these semiconductor devices. During the conventional photo process, a defect can result from either an external process variable (e.g. manual wafer handling), or an internal one from environmental sources (unclean equipment sets). Others may be related to the process parameters themselves, such as a pattern anomaly, marginal processing by the equipment, or a previous defect on the wafer creating a nucleation site for more defects. Since microlithography defects can arise from a variety of sources, adopting flexible and efficient methods of measuring their effects are essential in maximizing the yield.

One methodology available to characterize and monitor complete microlithography processing involves exposing most of a photoresist layer, leaving behind a developed pattern of resist lines as a repetitive pattern. Formation of the repetitive pattern of resist lines, used in conjunction and properly sampled in a defect metrology tool (described below) can lead to timely in-line feedback about the nature of possible processing defects present. Furthermore, the results of such a short loop may enable identification of a defect cause using fewer processing steps.

Figure 6B:
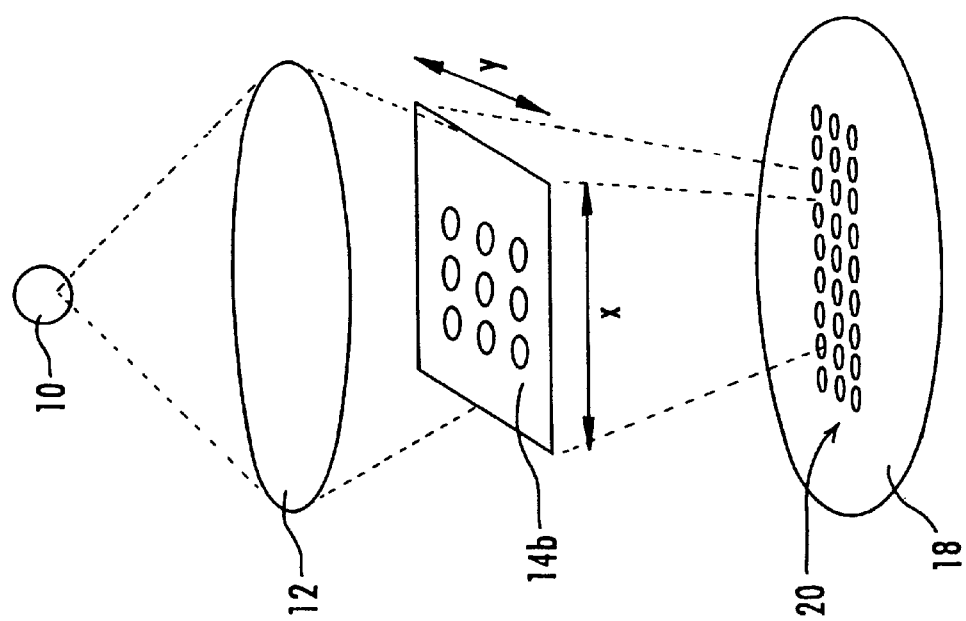
FIGS. 6A and 6B are diagrams illustrating apparatus having reticles for forming repeating line patterns and hole patterns for line monitoring and contact monitoring, respectively.
Figure 6A:
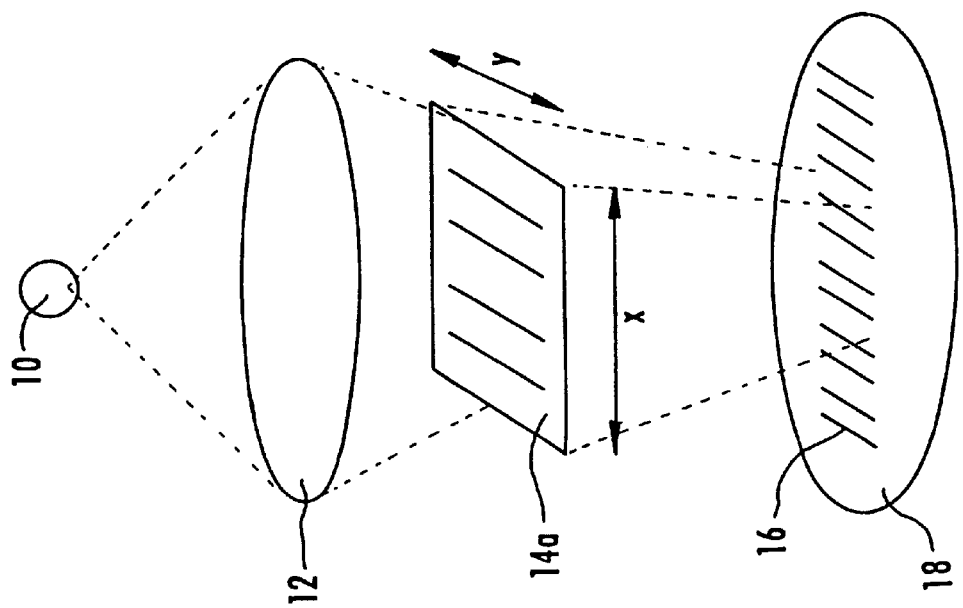

Two types of processes can be monitored in order to best represent two cases of resist behavior. FIG. 6A is a diagram illustrating one type of process, where an illumination source 10 outputs radiation at a prescribed wavelength (I-line or deep ultraviolet (DUV)) to a reticle 14a via a lens 12, causing a repetitive pattern 16 of lines to be formed on a wafer 18. FIG. 6B illustrates an alternative case of resist behavior, where a reticle 14b causes most of the resist on the wafer 18 to remain mostly exposed, forming a repetitive pattern of contact vias 20.

Both monitor strategies of FIGS. 6A and 6B are short-loop lithography processes, in which resist is first applied to a clean test wafer, described below. The test wafer 18 is then exposed with a reticle 14a or 14b processing a repeatable x by y pattern at an optimized exposure energy and focus setting. The pattern 16 or 20 of resist is formed following a developing step, described below. The patterned resist wafer can then be sampled and reviewed on a metrology tool, also described below as a wafer inspection system, and be compared with previous statistical process data collected for the equipment set and process combination in order to determine the overall status of the process.

In the case of the "line monitor" defect inspection, the types of defects present in the process reflect the ability of the developer to clear out the exposed resist, as well as reveal undeveloped defects still present in the remaining resist. In both instances, if left uncorrected, the process could cause shorting or a bridging of lines in the product (i.e., the final integrated circuit). In addition to the resolution of contact holes through the resist to the silicon, the "contact monitor" model in FIG. 6B relies on the ability of the unexposed resist to remain selectively unaffected in the develop process. Hence, the "dual monitor" system of FIGS. 6A and 6B provides feedback in a timely and inexpensive manner, saving valuable chemicals, process time and product. Lithography process defects typically form from one of two major process sources, namely the resist or the developer. In some cases, exposure nonuniformities may be caused from the wafer stepper. Focus or temperature irregularities within a localized area during exposure may sometimes cause detectable defects. The use of the monitors of FIGS. 6A and 6B not only manages to cover both cases to the logical extremes of lithography processing, but also enables the number of interactive variables associated with causing a defect to be minimized.

MONITORING DEFECTS USING REUSABLE TEST WAFER

Figure 1A:
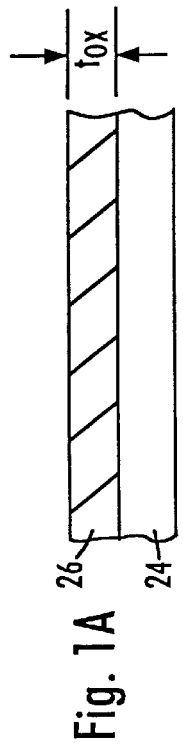
Figure 1B:
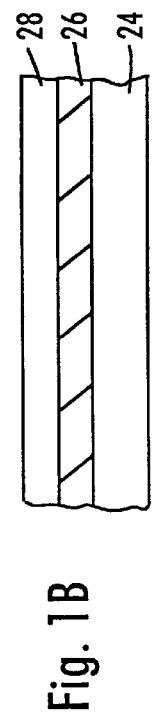
Figure 4A:
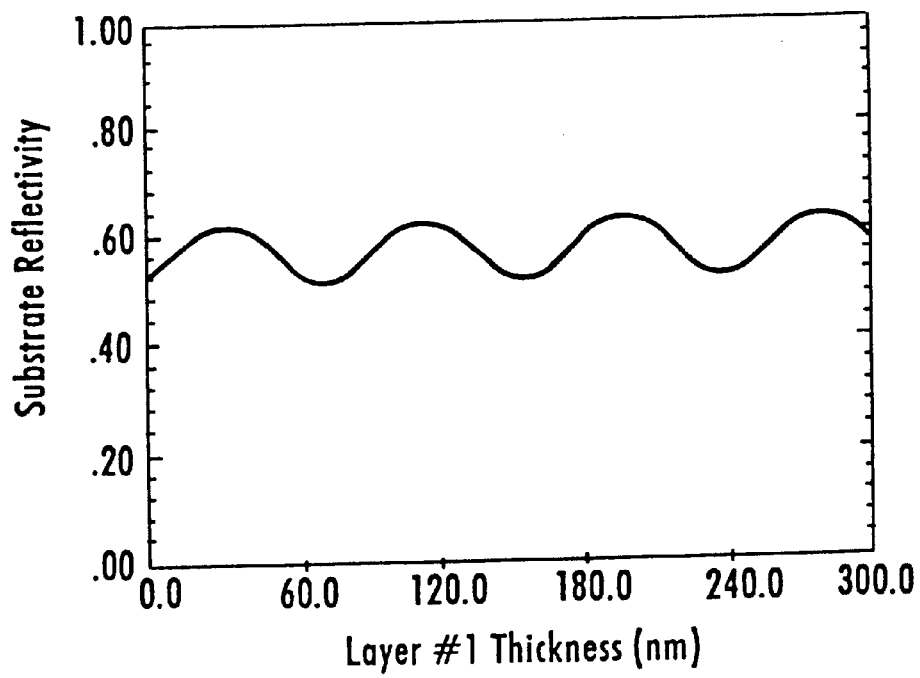
FIGS. 4A and 4B are diagrams illustrating reflectivity curves of the oxide test wafer of FIG. 1 versus oxide thickness for deep ultraviolet and I-line wavelengths, respectively.
Figure 4B:
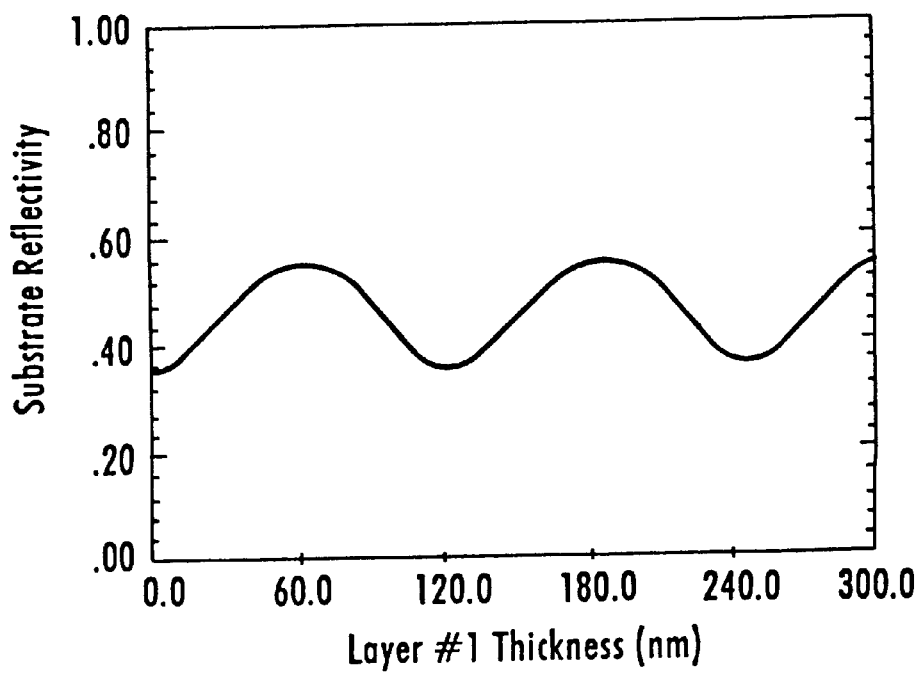
Figure 5A:
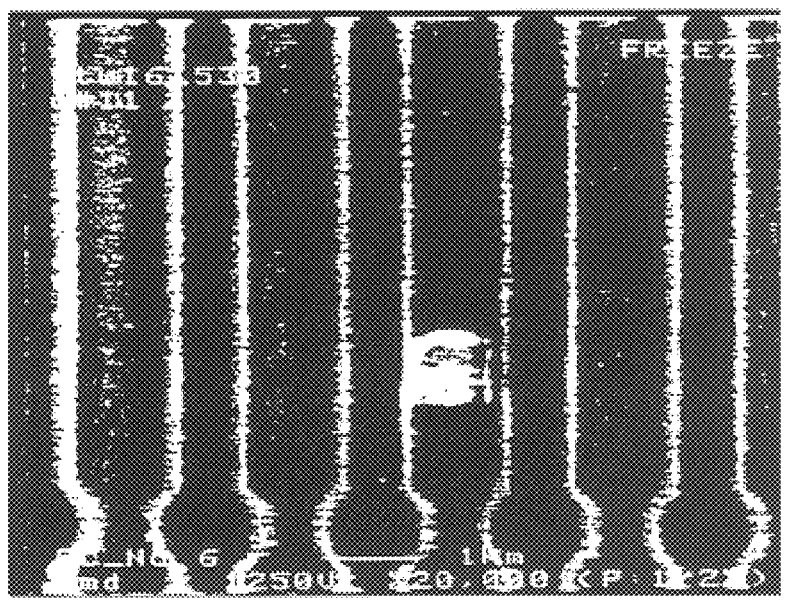
FIGS. 5A, 5B, 5C and 5D are photomicrographs illustrating defects detected using the systems of FIGS. 1 and 2.
Figure 5B:
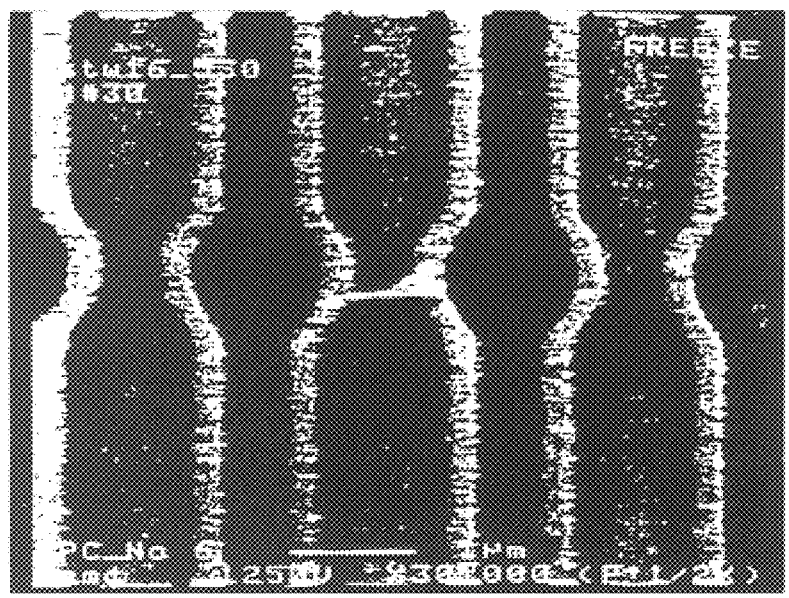
Figure 5C:
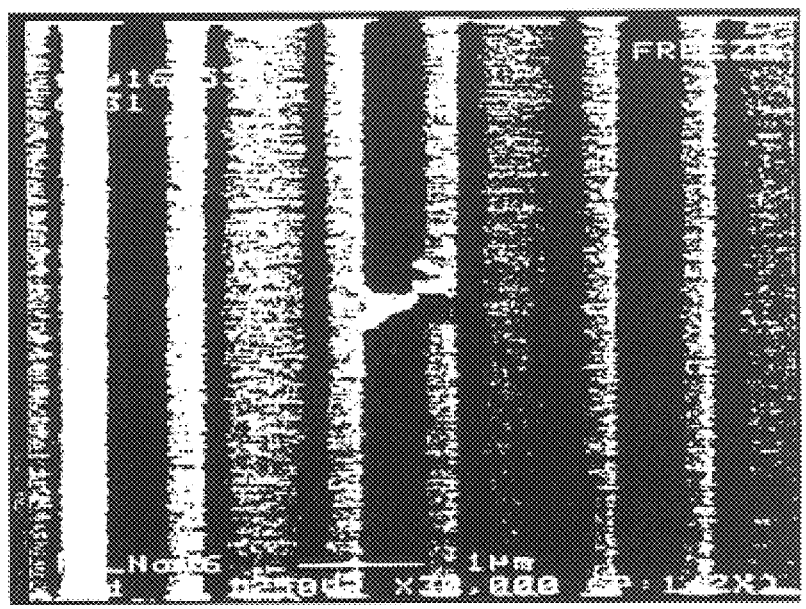
Figure 5D:
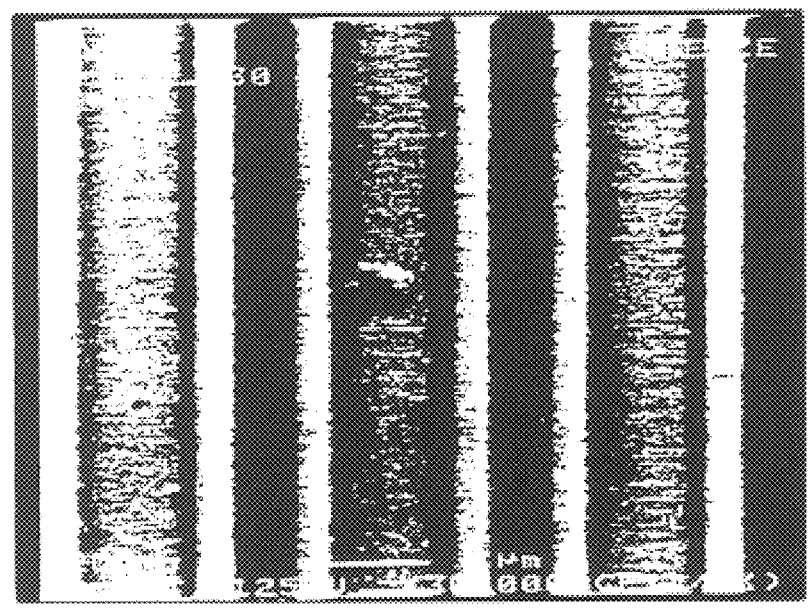

FIGS. 1A–1E are diagrams illustrating the method for monitoring defects generated during formation of a pattern on a wafer according to an embodiment of the present invention. FIG. 2 is a system configured for performing the method of FIGS. 1A–1E. According to the disclosed embodiment, a resist pattern is formed on a reusable test wafer according to a prescribed fabrication process. For example, FIG. 1A illustrates a test wafer formed in a test wafer generation system 70 (FIG. 2) having a silicon substrate 24 and an oxide layer 26 overlying on the silicon substrate 24. The oxide layer 26 is grown using conventional techniques, for example using a standard thermal oxidation process in a vertical or a horizontal furnace. The oxide layer 26 is grown on the silicon substrate 24 to a thickness $t_{ox}$ corresponding to a minimum reflectance for an exposure wavelength used during formation of the pattern 16 or 20 on the wafer 18. Specifically, FIG. 4A is a diagram illustrating a reflectivity curve of an oxide test wafer relative to oxide thickness. As shown in FIG. 4A, the substrate reflectivity is a minimum of 1600 Å for a DUV wavelength as the exposure wavelength. Similarly, FIG. 4B illustrates a reflectivity curve for I-line oxide reflectivity, where the reflectivity is a minimum at an oxide thickness of substantially equal to 1200 Å. Hence, the thickness ($t_{ox}$) of the oxide layer 26 is 1200 angstroms (Å) for I-line lithography process (365 nanometer wavelength), or 1600 Å for DUV lithography process (248 nanometer wavelength).

Figure 1C:
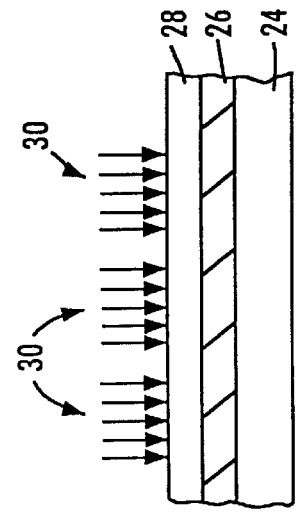

Following formation of the test wafer 22, a resist pattern is formed on the oxide layer 26 according to a prescribed fabrication process in a photolithography system 72. Specifically, a photoresist layer 28 is deposited on the oxide layer 26 in FIG. 1B according to the prescribed photolithography fabrication process under evaluation for defects. Regions 30 of the photoresist layer 28 are then exposed in FIG. 1C with a reticle, for example 14a having the repetitive pattern 16 as shown in FIG. 1C. As recognized in the art, the photoresist 28 is reactive to the illuminated light at the exposed regions 30. Use of a repetitive resist pattern also maximizes the sensitivity of the wafer inspection system.

Figure 1D:
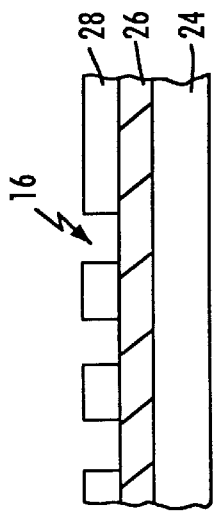

After the regions 30 of the photoresist layer 28 are exposed, the photoresist layer 28 is developed in FIG. 1D using standard developer techniques to form the repetitive pattern 16 in the photoresist layer 28. According to the disclosed embodiment, the reticle 14 has a repeating pattern mask having the smallest design rule as a product. Design rules specify the layout rules that specify the allowable minimum design dimension, for example line width, contact size, spacings between patterns defined by the same mask, and spacings between patterns defined by different masks. Examples of such layout rules include minimum and maximum line widths. Hence, the repeating pattern mask may have a configuration of repeating parallel lines each having a prescribed width and spacing. Hence, the repeating pattern mask maximizes the inspection tool's resolution capability for defect capture. If a repetitive mask pattern is used to monitor defects for random logic products, the pattern should be of similar design rule (line, space, pitch). Otherwise, any type of mask pattern (e.g., random logic, microprocessor) is acceptable.

Following formation of the pattern 16 on the test wafer 22, the pattern 16 is inspected by a wafer inspection system 74 to detect defects on the repetitive pattern. Specifically, a pixel image of the photoresist pattern 16 is generated in step 40 by the wafer inspection system 74. According to the disclosed embodiment, an exemplary wafer inspection system is the KLA 2132 model or 2135 model for detecting pattern defects. The KLA wafer inspection system is set to the highest sensitivity by using the smallest qualified pixel size, where the pixels have a dimension value of a maximum value of 0.39 microns, preferably 0.25 microns.

Figure 3:
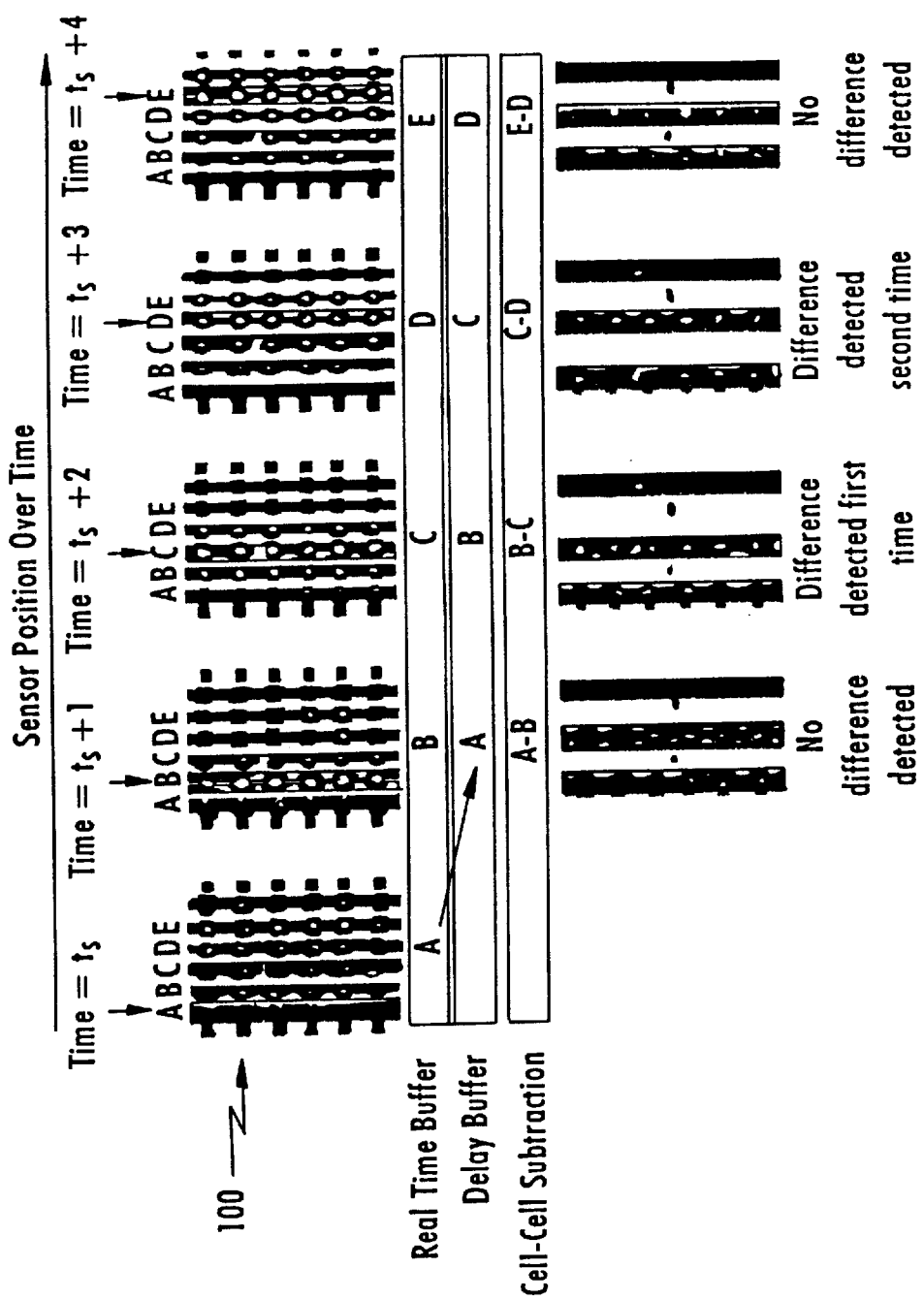
FIG. 3 is a diagram illustrating the step of detecting a defect in the method of FIG. 1 by performing a cell to cell comparison of a repetitive pattern.
Figure 7:
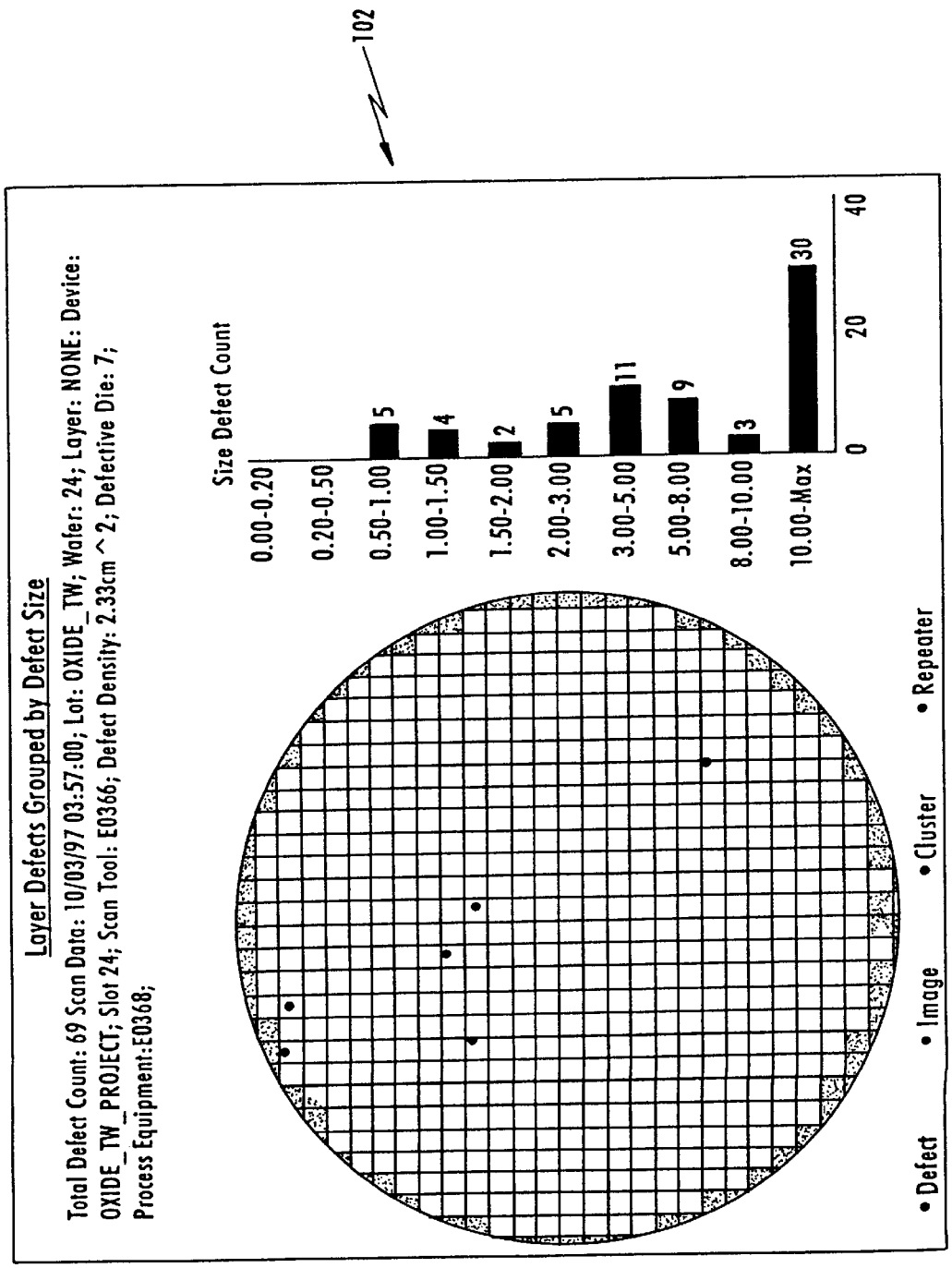
FIG. 7 is a diagram illustrating a defect map output by the wafer inspection system of FIG. 2.

The wafer inspection system then performs pixel-based comparisons between adjacent patterns of the repetitive pattern in step 42 to detect a defect. Specifically, FIG. 3 is a diagram illustrating a pattern comparison of images where a cell to cell comparison of the repetitive pattern from the image is used to detect defects. Specifically, FIG. 3 illustrates a plurality of images 100 having a pixel resolution of, for example, 0.25 microns. The wafer inspection system performs the pixel-based cell by cell comparison in step 42 throughout the repeating patterns on the wafer, and generates a wafer defect map 102 in step 44 specifying locations and sizes of the detected defects from the image of the test wafer. An example of a defect map generated by the KLA wafer inspection system is illustrated in FIG. 7.

Following generation of the wafer map 102, an engineer or technician will then review defects detected from the wafer map 102 using an optical review system 78, for example the KLA 2608 or the Leica MIS-200 in step 46. A scanning electron microscope (SEM) inspection system 80 will then be used to review defects that are too small for detection by the optical system in step 48. The detected defects by the optical system 78 and the SEM inspection system 80 are then forwarded to defect analysis and review tools within the defect review system 76 for classification in step 50. A list of defect codes is then used to assign a name, defect type, and defect cause to each detected defect based on engineering and technician experiences. The step of assigning a name and defect type and cause to each detected defect may be performed by a human operator or by a computer-based system having been programmed with engineering criteria to classify each defect. After a sample of defects is classified and categorized, a pareto chart prioritizing the defects and the corresponding cause can be generated in step 52. The prioritized list of defects thus enables an engineer or technician to identify the top killer defects that need to be eliminated for yield improvement by reduction in defect density. Following defect review and classification, a determination can then be made in step 54 whether the repetitive pattern has a defect density below a prescribed threshold acceptable for wafer fabrication. The prescribed threshold may be established based on past production performance and yield engineering. If the defect density is below the prescribed threshold, then the test wafer having the repetitive pattern indicates that the fabrication process is acceptable for production. However, if the defect density is above the prescribed threshold, then the repetitive pattern on the test wafer provides a quick indication that the fabrication process fails the established yield requirements for production.

Hence, a pass/fail criteria can be established based on the total number of defects or defect density. Hence, equipment and resist process can be qualified daily using the photoresist pattern formed on the test wafer.

FIG. 2 is a block diagram illustrating the defect monitoring system for monitoring defects encountered during photolithography according to an embodiment of the present invention. As shown in FIG. 2, the defect monitoring system includes a test wafer generation system 70 for generating the test wafer 22, described below. The defect monitoring system also includes a photolithography system for forming the repetitive pattern 16 on the test wafer 22. The system also includes a wafer inspection system 74 for detecting defects on the repetitive patterns based on pixel-based comparisons between adjacent patterns of the repetitive pattern. An exemplary wafer inspection system is the KLA model 2132 or model 2135, although an equivalent pattern recognition system may be used. According to the disclosed embodiment, the KLA 2132 is set into an array mode to perform cell by cell comparisons, where the pixel is set to the size of 0.39 micron pixel sizes, or 0.25 micron pixel sizes, and where the KLA 2132 is set to 100% scan and full wafer inspection. The wafer inspection system 74 outputs a defect map 102, as shown in FIG. 7, for review and analysis of the defects.

The system of FIG. 2 also includes a defect review system 76 that classifies the detected defects by respective types and causes to generate a prioritized list of the defect causes. As shown in FIG. 2, the defect review system includes an optical review system 78, used to classify the defects detected by the wafer inspection system 74. The defect review system 76 also includes an SEM inspection system 80 for detecting defects that are not readily detected by the wafer inspection system 74 or the optical review system 78. The defect review system 76 reviews the defects and classifies the defect types, and identifies the defect causes and sources, as described above. The defect review system 76 also enables determination of whether the detected defect density is less than a prescribed threshold, indicating that the lithography process under evaluation as performed by the photolithography system 72 is acceptable.

As shown in FIG. 2, the system also includes a test wafer cleaning system 82 configured for cleaning the test wafer 22 for reuse by removing the repetitive pattern 16 from the test wafer 22 for reuse in the photolithography system 72.

Proper cleaning of the test wafer is important to ensure reuse in the above-described defect detection systems. After removing the old resist pattern on a test wafer, the test wafer must be as clean as a new test wafer (almost zero defects per wafer). If particles or residues are left on the test wafer after cleaning, they may be erroneously detected by the defect inspection tool during retesting and erroneously categorized as resist pattern defects in the new tool.

The cleaned test wafer also must not affect the pattern recognition operations of the inspection tool. If oxide thickness loss is high wafers will look "different" to the pattern recognition inspection systems such as the KLA 2132 or 2135. In addition, the system will fail wafer alignment tests, resulting in incomplete inspections. If an inspection program needs to be continually adjusted, then the manufacturing process cannot be considered robust.

According to the disclosed embodiment, oxide wafers are used that have an appropriate thickness for desired resist thickness at I-line or DUV wavelengths, and which can be recleaned using SPM-APM chemistry, described below. In particular, the SPM-APM chemistry is used for pattern defect monitoring techniques in photolithography. Hence, the disclosed embodiment provides a method for cleaning a test wafer with minimal oxide loss and which does not interfere with pattern recognition systems.

Figure 8:
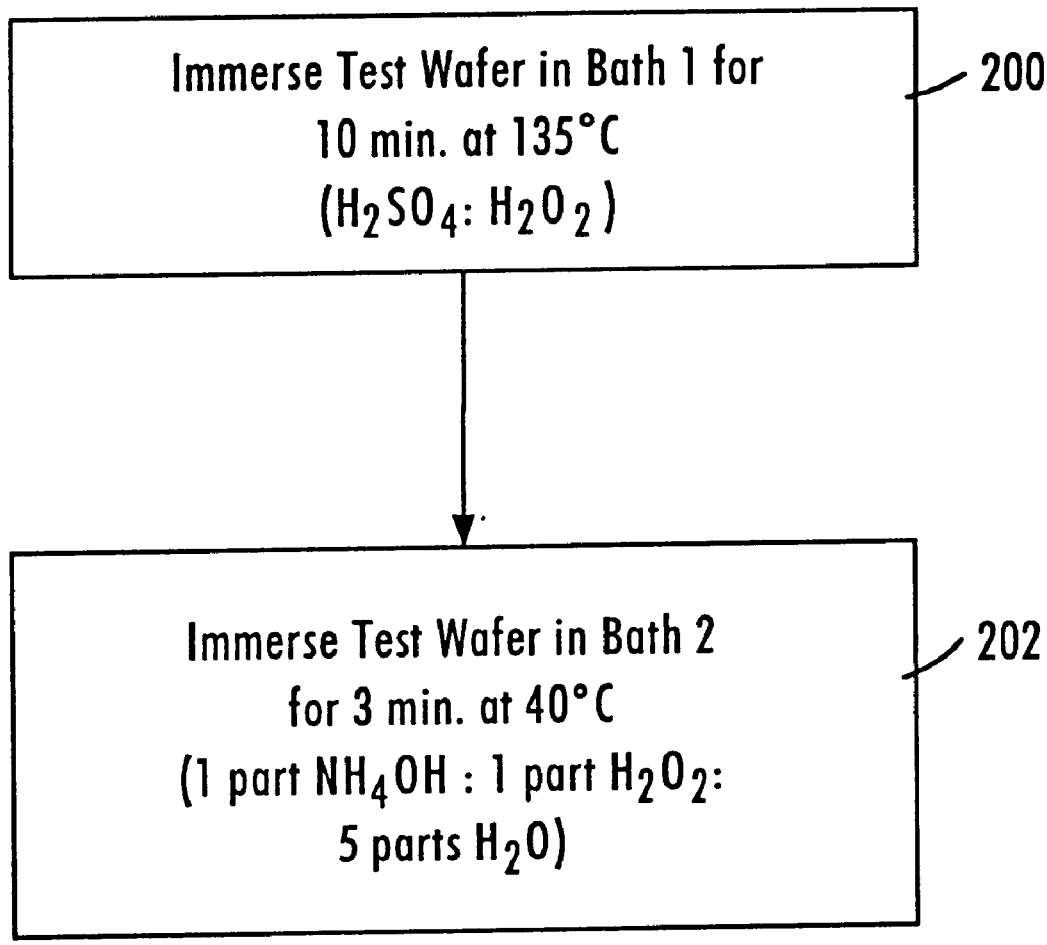
FIG. 8 is a flow diagram illustrating a method for cleaning a photolithographic pattern from a test wafer according to an embodiment of the present invention.

FIG. 8 is a method for cleaning the photolithographic pattern 16 from the test wafer 22 according to an embodiment of the present invention. The test wafer 22 is cleaned in two cleaning steps. Specifically, the photoresist layer 28 forming the photolithographic pattern 16 is removed from the oxide layer 26 in step 200 by applying a first solution having sulfuric acid and hydrogen peroxide for a first prescribed interval in step 200. According to the disclosed embodiment, the first solution is sprayed on the wafer in for approximately 10 minutes at approximately 135° C., where the first bath contains equal parts of sulfuric acid and hydrogen peroxide.

Following the removal of the photoresist layer 28 in step 200, the test wafer 22 enters a second step 202, where polymer particles loosely adhering to the oxide layer 26 are removed by applying a second solution in step 202. According to the disclosed embodiment, the second solution is applied by spraying the wafer 22 for approximately 3 minutes. the second solution containing one part ammonium hydroxide, one part hydrogen peroxide, and five parts water at approximately 40° C. Although steps 200 and 202 are illustrated as spraying the wafer 22, the first and second solutions can be applied using a clean sink with modifying times for steps 200 and 202 depending on etch rates.

The method of cleaning the photolithographic pattern 16 from the test wafer 22 provides superior cleaning for the photoresist layer 28 from the oxide layer 26, with minimal loss of oxide thickness (approximately 1–2 Å per cleaning cycle). Hence, the oxide test wafer 22 can be reused for multiple times for particle monitoring in photolithography, etching, and chemical vapor deposition (CVD) systems. Especially for photolithography, minimum oxide loss will guarantee the pattern recognition wafer inspection system to work over many reuses. Hence, the disclosed arrangement provides a low cost technique for testing processes, since the test wafer 22 can be used for repeated testing without adversely affecting the alignment and inspection capabilities of the wafer inspection system 74.

According to the disclosed embodiment, a reusable test wafer provides a low cost technique in monitoring defects generated from a track resist process in fabrication of integrated circuits. The disclosed defect monitoring technique enables circuit pattern defects to be detected from the "print" or lithographic process during manufacturing. The disclosed arrangement also improves reliability of integrated circuits by early detection of potential hazard defects. Although the potential hazard defects may not "kill" the device by causing a fatal defect, the potential hazard defects may affect long term reliability of the integrated circuit. Finally, the disclosed arrangement reduces manufacturing costs of integrated circuits because of the lower rework rate for defects in the photolithography area.

Although the disclosed embodiments described detecting defects in photolithography, the disclosed embodiment can also be applied to detecting defects in etch tools or CVD tools by performing defect counts before processing and after processing to determine the difference caused by the respective tools.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

We claim:

1. A method of monitoring defects generated during formation of a pattern on a wafer, comprising:

(a) forming a reusable test wafer having an oxide layer overlying on a silicon substrate of the wafer;

(b) forming a repetitive pattern on the oxide layer according to a prescribed fabrication process, the repetitive pattern related to a prescribed design product rule by depositing a photoresist layer on the oxide layer according to the prescribed fabrication process, exposing regions of the photoresist layer with a reticle, having the pattern, at a wavelength specified by the prescribed fabrication process, and developing the photoresist layer to form the repetitive pattern in the photoresist layer;

(c) inspecting the repetitive pattern to detect a defect on the repetitive pattern;

(d) classifying the defect to a defect type and defect cause;

(e) determining whether the repetitive pattern has a defect density below a prescribed threshold acceptable for wafer fabrication; and (f) removing the repetitive pattern from the oxide layer following the determining step by:

(i) removing photoresist forming the repetitive pattern from the oxide layer; and (ii) removing polymer particles loosely adhering to the oxide layer following the photoresist removing step, wherein steps (b) through (f) are repeated following the removing step (f) at least once.

2. The method of claim 1, wherein the test wafer forming step comprises growing the oxide layer on the silicon substrate to a thickness corresponding to a minimum reflectance for an exposure wavelength used during the repetitive pattern forming step.

3. The method of claim 2, wherein the oxide layer growing step comprises growing the oxide to a thickness substantially equal to 1200 Angstroms for an I-line wavelength as said exposure wavelength.

4. The method of claim 2, wherein the oxide layer growing step comprises growing the oxide to a thickness substantially equal to 1600 Angstroms for a deep ultraviolet wavelength as said exposure wavelength.

5. The method of claim 1, wherein the prescribed design product rule specifies a smallest design rule as a product.

6. The method of claim 1, wherein the inspecting step comprises:

generating an image of the test wafer having the pattern in an optical inspection tool;

generating a wafer map specifying locations and sizes of the detected defect from the image of the test wafer.

7. The method of claim 6, wherein the inspecting step further comprises detecting a defect undetectable by the optical inspection tool using a scanning electron microscope inspection system.

8. The method of claim 1, wherein the classifying step comprises compiling the defects by the defect type and defect cause to prioritize the defect causes causing the defect density.

9. The method of claim 1, wherein:

the photoresist removing step comprises applying a first solution having sulfuric acid and hydrogen peroxide at a first prescribed temperature for a first prescribed interval; and the polymer particles removing step comprises applying a second solution having ammonium hydroxide and hydrogen peroxide at a second prescribed temperature for a second prescribed interval.

10. The method of claim 1, wherein the removing step removes a maximum of 2 angstroms from the oxide layer.

11. The method of claim 1, wherein the removing step removes the pattern without changing a reflectivity of the test wafer.

12. The method of claim 1, wherein the inspecting step includes performing a pixel-based comparison between adjacent patterns of the repetitive pattern to detect the defect.

* * * * *